United States Patent
Mochizuki et al.

(10) Patent No.: US 6,308,524 B1
(45) Date of Patent: Oct. 30, 2001

(54) COOLER FOR ELECTRONIC DEVICES

(75) Inventors: Masataka Mochizuki; Koichi Mashiko; Kazuhiko Goto; Yuji Saito, all of Tokyo (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 09/300,278

(22) Filed: Apr. 27, 1999

Related U.S. Application Data

(62) Division of application No. 09/026,896, filed on Feb. 9, 1998.

(30) Foreign Application Priority Data

Feb. 10, 1997 (JP) .................................................. 9-041544
Aug. 13, 1997 (JP) .................................................. 9-231839

(51) Int. Cl.[7] .................................................. F25D 23/12
(52) U.S. Cl. .................................. 62/259.2; 165/104.21; 165/104.33
(58) Field of Search .................. 62/259.2; 165/104.21, 165/104.33

(56) References Cited

U.S. PATENT DOCUMENTS

| | | | |
|---|---|---|---|
| 4,015,438 | * | 4/1977 | Kinsell et al. ................ 62/402 X |
| 4,934,154 | * | 6/1990 | Altoz et al. ................... 62/172 X |
| 5,056,335 | * | 10/1991 | Renninger et al ................ 62/402 |
| 5,107,398 | * | 4/1992 | Bailey ........................... 361/384 |
| 5,183,104 | * | 2/1993 | Novotay ..................... 165/104.33 |
| 5,339,214 | * | 8/1994 | Nelson ........................... 361/695 |
| 5,383,340 | | 1/1995 | Larson et al. . |
| 5,413,167 | * | 5/1995 | Hara et al. ....................... 165/86 |
| 5,422,787 | * | 6/1995 | Gourdine ........................ 361/697 |
| 5,477,417 | * | 12/1995 | Ohmori et al. .................. 361/695 |
| 5,484,012 | * | 1/1996 | Hiratsuka ......................... 165/40 |
| 5,566,377 | * | 10/1996 | Lee ................................ 361/695 |
| 5,694,295 | * | 12/1997 | Mochizuki et al. ........ 165/104.33 |
| 5,731,954 | * | 3/1998 | Cheon ............................ 361/699 |
| 5,781,409 | * | 7/1998 | Mecredy, III ................... 361/687 |

FOREIGN PATENT DOCUMENTS

| | | | |
|---|---|---|---|
| 487026 | * | 6/1938 | (GB) ................................. 62/172 |
| 403070975 | * | 3/1991 | (JP) ................................ 62/259.2 |
| 405223375 | * | 8/1993 | (JP) ................................. 62/172 |

\* cited by examiner

*Primary Examiner*—William Doerrler
*Assistant Examiner*—Mark Shulman
(74) *Attorney, Agent, or Firm*—Oblon, Spivak, McClelland, Maier & Neustadt, P.C.

(57) ABSTRACT

An electronic device cooler for cooling an exothermic member arranged in a case, comprises: an air compressor for adiabatically compressing the air in the case; a heat pipe for discharging the heat of the air, which is compressed to have an elevated temperature by the air compressor, to the outside of the case; and an expansion turbine for adiabatically expanding the pressurized air, which is derived of its heat by the heat pipe, to cool it.

8 Claims, 7 Drawing Sheets

COOLER FOR ELECTRONIC DEVICES

This application is a Div. Ser. No. 09/020,896 filed Feb. 9, 1998.

BACKGROUND OF THE INVENTION

1. Field of the Invention

The present invention relates to a cooler for an electronic device, for cooling an exothermic member arranged in the case of the electronic device by releasing the heat of the exothermic member through a heat pipe.

2. Related Art

In the field of computers, the outputs of electronic elements such as a CPU are increased in the prior art in accordance with an increase in the number of functions and a rise in the processing rate. As an example of the device for cooling the electronic elements, there is known a cooling device which is constructed by mounting a micro fan in the case of a personal use computer (as will be called the "personal computer"), to release the heat of the electronic elements to the outside of the case by the air flow established by the micro fan.

In the prior art, there is also known a cooling device which is constructed by connecting one end portion of a heat pipe in a heat transferable manner to the electronic elements and holding the other end portion in contact with an electromagnetic shield plate of an aluminum plate mounted on the back face (i,e., the face at the computer case) of the computer, to provide a radiation face.

On the other hand, the reductions in the size and weight of the computer are earnestly desired in recent years. This has extremely restricted the space for the cooling device to occupy the inside of the computer case.

However, the cooling device using the micro fan is constructed to circulate the air in the case space in which the numerous parts are densely mounted. These numerous parts raise serious resistances to the air flow so that the air flow is blocked to confine the heat in the case. On the other hand, the air heated by the hot parts comes into contact with the remaining parts, located downstream, so that these downstream parts are inevitably heated.

These disadvantages can be eliminated if the fan for establishing the cooling air flow is given a high capacity. As this capacity increases, however, the size of the fan is enlarged so much as to fail to match the personal computer which is desired to reduce its size and weight.

In the cooling device adopting the heat pipe, on the contrary, the heat, as generated by the electronic elements, is transferred by the heat pipe to the electromagnetic shield plate in the case until it is released to the outside from the shield plate. As a result, the heat to be released from the shield plate is partially returned to and confined inside the case. This raises a problem that the existing parts other than the electronic elements are inevitably heated.

SUMMARY OF THE INVENTION

A main object of the invention is to efficiently cool an exothermic member arranged in a casing.

Another object of the invention is to prevent other members from being heated by the exothermic member.

Therefore, the cooler of the invention is constructed to comprise: an air compressor for adiabatically compressing the air in a case; a heat pipe for releasing the heat of the compressed air to the outside of the case; and an expansion turbine for adiabatically expanding the heat-released but pressurized air to cool it.

According to the invention, the high temperature air, as heated the exothermic member, in the case is sucked by the air compressor to cool the exothermic member primarily. The sucked air is adiabatically compressed so that its temperature is elevated. The heat of the pressurized air is then released by the heat pipe to the outside of the case. The pressurized air thus derived of the heat is adiabatically expanded by the expansion turbine so that its temperature is lowered. As a result, the exothermic member is secondarily cooled.

In the invention, the heat in the case can be transferred to the outside by the heat pump using air as a heat transfer medium. Moreover, the heat of the temperature-elevated air is released by the heat pipe to the outside of the case so that the cooling efficiency is improved.

In the invention, moreover, a plurality of exothermic members arranged in the case and a radiation unit having an air-cooling fan are connected through heat pipes. The cooling fan is arranged in the periphery of the case to discharge the air from the inside to the outside of the case. As a result, the heat of the individual exothermic members is transferred by the heat pipes to the radiation unit, from which the heat is entrained by the air flow to the outside of the case.

As a result, the heat of the plural exothermic members is not released to the inside of the case. This improves the efficiency for cooling the plural exothermic members. Moreover, the remaining members in the case are left unheated. The radiation unit may be exemplified by such a heat sink as is cooled by the air flow of a cooling fan.

Here, the cooler of the invention may be used for cooling such electronic parts of the CPU of a computer as will generate heat.

The above and further objects and novel features of the invention will more fully appear from the following detailed description when the same is read with reference to the accompanying drawings. It is to be expressly understood, however, that the drawings are for the purpose of illustration only and are not intended as a definition of the limits of the invention.

DETAILED DESCRIPTION OF THE PREFERRED EMBODIMENTS

The invention will be described in connection with its specific embodiments with reference to the accompanying drawings.

Figure 1:
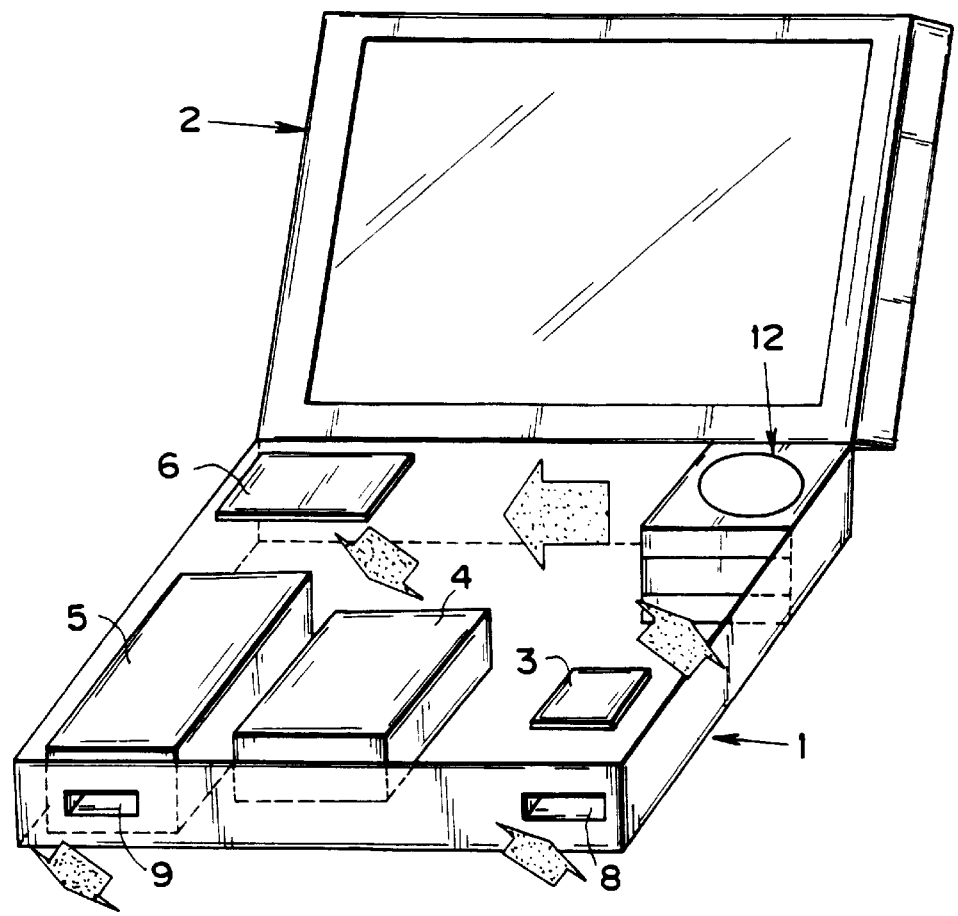
FIG. 1 is a schematic perspective view showing a notebook type personal computer to which a cooler of the invention is applied.

In an embodiment shown in FIG. 1, the invention is applied for cooling a central processing unit (CPU) which is mounted on a notebook type personal computer. A personal computer case 1 is made of a metal such as an aluminum alloy or a magnesium alloy into the shape of a hollow container. This personal computer case 1 is formed into a box shape, as shown in FIG. 1, which is equipped at its one upper end edge with such a display 2 as is so hinged on a (not-shown) pin that it can be opened/closed with respect to the personal computer case 1.

In the personal computer case 1, there are mounted exothermic members including a CPU 3, a hard disk drive (HDD) 4, a battery 5 and a PC card (PCMCIA) 6. On the other hand, the personal computer case 1 is opened in its wall at this side, as shown in FIG. 1, to form two rectangular air vents 8 and 9. These air vents 8 and 9 are arranged at a spacing at the right and left sides of FIG. 1.

Figure 3:
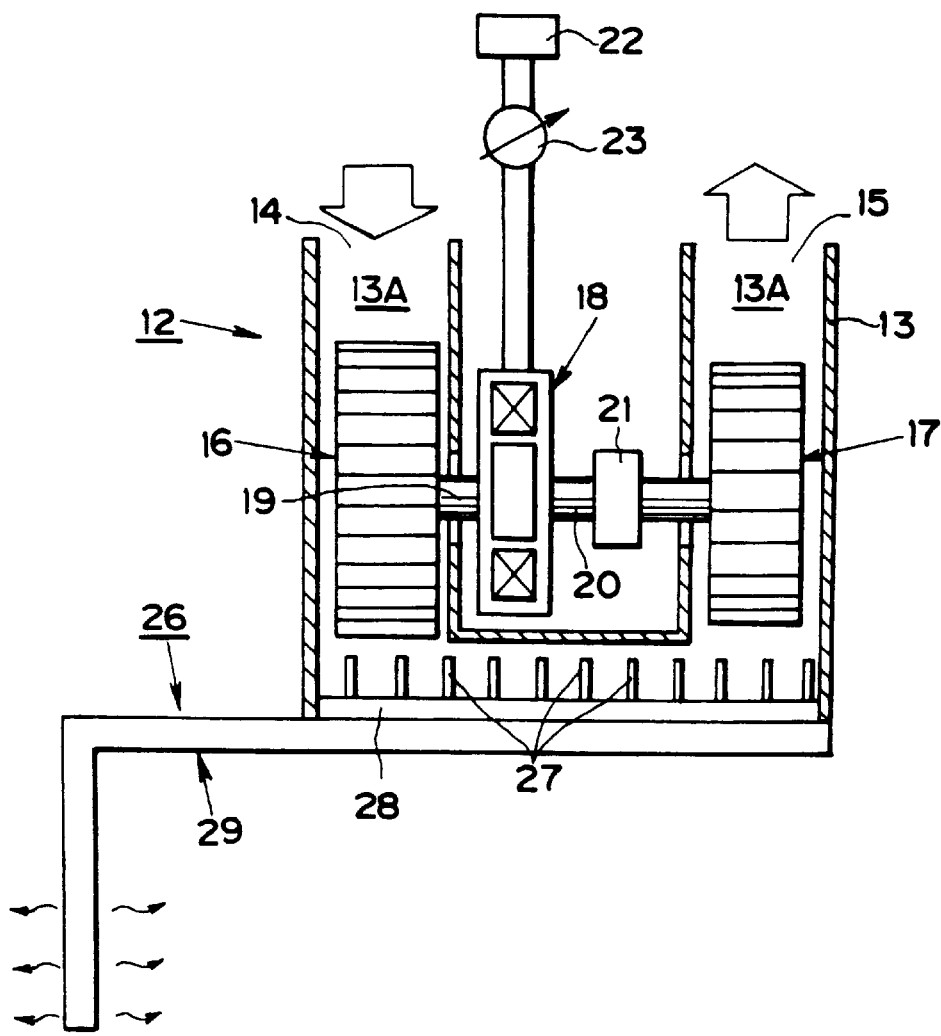
FIG. 3 is a section showing a specific construction of the cooler.

In the inside of the case 1 at the righthand deep corner, as shown in FIG. 1, there is arranged a Brayton cooler 12. This Brayton cooler 12 is equipped with a casing 13 of aluminum, for example. In this casing 13, there is formed an air passage 13A which is shaped to confront each other at the right and left sides, as shown in FIG. 3. In the air passage 13A at its lefthand end portion of FIG. 3, there is formed an intake port 14. This intake port 14 is directed toward the CPU 3 and communicates with the inside of the personal computer case 1. In the air passage 13A at its righthand end portion of FIG. 3, there is formed a discharge port 15. This discharge port 15 is directed to the parts other than the CPU 3 and also communicates with the inside of the case 1.

In the air passage 13A below the intake port 14, as shown in FIG. 3, there is arranged an air compressor 16. This air compressor 16 is provided for compressing the air in the case 1 adiabatically and is exemplified by the fan or blower type. In the air passage 13A below the discharge port 15 of FIG. 3, on the other hand, there is arranged an expansion turbine 17. This expansion turbine 17 is provided for adiabatically expanding the air, as pressurized by the air compressor 16, to cool it.

In the casing 13 at its portion confronting the air passage 13A, namely, between the air compressor 16 and the expansion turbine 17, on the other hand, there is arranged a heat pipe unit 26. This heat pipe unit 26 is equipped with a plate 28 having a number of fins 27, and a heat pipe 29 fitted on the plate 28. The plate 28 and the fins 27 are made of a metal such as aluminum or copper. Moreover, the plate 28 directs the fins 27 toward the air passage 13A and has its outer peripheral edge fitted on the inner face of the casing 13.

The heat pipe 29 is exemplified by bending a flat container generally into the shape of letter L. One end portion of this heat pipe 29 is fitted on the lower face of the plate 28, as shown in FIG. 3. The other end portion of the heat pipe 29 is exposed to the outside of the personal computer case 1.

In the casing 13, but outside the air passage 13A., namely, between the expansion turbine 17 and the air compressor 16, as shown in FIG. 3, there is arranged a motor 18 acting as a drive source. A first shaft 19 of the motor 18 is connected to the air compressor 16. On the other hand, a second shaft 20 of the motor 18 is connected to the expansion turbine 17. In short, the motor 18 drives the air compressor 16 and the expansion turbine 17. Here in the power transmission line between the motor 18 and the expansion turbine 17, there is arranged a clutch mechanism 21 for connecting and disconnecting the power transmission line.

To the motor 18, moreover, there is connected a DC power supply 22. In the circuit between this DC power supply 22 and the motor 18, there is arranged a controller 23. This controller 23 is provided for changing the DC voltage to be applied from the DC power supply 22 to the motor 18, to a predetermined level.

Figure 4:
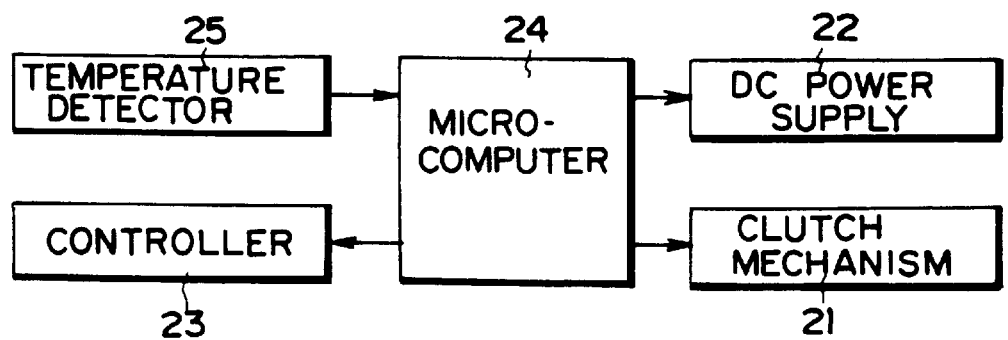
FIG. 4 is a block diagram showing a control circuit for the cooler.

Moreover, the personal computer case 1 is ecuipped therein with a temperature detector 25 and a microcomputer 24 as shown in FIG. 4. This temperature detector 25 is provided for detecting the temperature of the air in the case 1. The microcomputer 24 is provided for turning ON/OFF the (not-shown) switch of the DC power supply 22, for controlling the connection/ disconnection of the clutch mechanism 21 and for controlling the voltage of the controller 23, so that it acts as a control unit. On the other hand, the microcomputer 24 is stored in advance with the data of such a voltage to be applied to the motor 18 as corresponds to the temperature of the inside of the personal computer case 1. Further stored in advance in the microcomputer 24 is data for providing a reference for the connection/ disconnection of the clutch mechanism 21. Moreover, the detection signal of the temperature detector 25 is input to the microcomputer 24. On the basis of the temperature detected by the temperature detector 25, more specifically, the microcomputer 24 controls the connection/disconnection of the clutch mechanism 21 and the change in the number of revolutions of the motor 18.

Here will be described the actions of the cooler for an electronic device thus constructed. As energized for the use of the personal computer, the CPU 3, the HDD 4, the battery 5 and the PC card 6 generate heat individually. The heat temporarily elevates the temperature of the air in the personal computer case 1.

When the motor 18 is energized, on the other hand, the air compressor 16 and the expansion turbine 17 are activated to suck the air, as indicated by arrows in FIG. 1, from the outside of the personal computer case 1 through the air vent 8 into the case 1. Moreover, the temperature-elevated air in the case 1 is sucked, as indicated by an arrow in FIG. 3, from the intake port 14 into the air passage 13A. In accordance with this, the CPU 3, the HDD 4, the battery 5 and the PC card 6 are primarily cooled. Especially because the intake port 14 is directed toward the CPU 3 having a higher heat generation than those of the HDD 4, the battery 5 and so on so that the CPU 3 is cooled to a satisfactory extent. This leaves the existing parts around the CPU 3 unheated.

The air, as sucked into the air passage 13A, flows to the heat pipe unit 26 while its temperature is elevated by the adiabatic compression of the air compressor 16. The heat of the air under pressure is transmitted through the fins 27 and the plate 28 to the one end portion of the heat pipe 29. Then, a working fluid, as confined in the container of the heat pipe 29, is heated to evaporate.

The vapor of this working fluid flows toward the end portion (as located at the outside of the personal computer case 1) where both the internal pressure and the temperature are low, so that it is derived of its heat by the air outside of the case 1 until it is condensed. In other words, the heat of the air in the personal computer case 1 is entrained by the working fluid of the heat pipe 29 to the outside of the case 1.

The air thus derived of the heat by the heat pipe 29 but still pressurized is adiabatically expanded to a lower temperature by the expansion turbine 17. This air having a lowered temperature is discharged from the discharge port 15 into the personal computer case 1 to cool the CPU 3, the HDD 4 and so on secondarily. This prevents the CPU 3, the HDD 4, the battery 5 and the PC card 6 from being overheated. Here, the air thus discharged from the discharge port 15 is discharged, as indicated by an arrow in FIG. 1, from the air vent 9 to the outside of the personal computer case 1.

According to the construction shown in FIGS. 1 to 6, on the other hand, the air in the personal computer case 1 is adiabatically compressed to elevate its temperature thereby to increase the temperature difference between the inside and the outside of the personal computer case 1. This promotes the heat radiating function of the heat pipe 29. As a result, the heat pipe 29 can improve its heat transferability without any increase in its radiation area thereby to reduce the size of the heat pipe unit 26. In other words, the space for the heat pipe unit 26 to occupy the inside of the personal computer case 1 may be reduced so that the case 1 can be small-sized.

Moreover, the construction shown in FIGS. 1 to 6 is equipped with the clutch mechanism 21 so that it can control the load on the motor 18 in accordance with the temperature of the inside of the personal computer case 1. Specifically, if the clutch mechanism 21 is released when the temperature of the inside of the case 1 is lower than a predetermined value, for example, the expansion turbine 17 is left inactive so that the air compressor 16 acts as a blower. In other words, no air compression is performed so that the load on the motor 18 is lightened to suppress any increase in the power consumption.

According to this specific embodiment, moreover, the number of revolutions of the air compressor 16 or the expansion turbine 17 can be controlled on the basis of the temperature of the inside of the personal computer case 1 so that the cooling capacity can be set to match the heat value of the CPU 3, the HDD 4 and so on.

Figure 5:
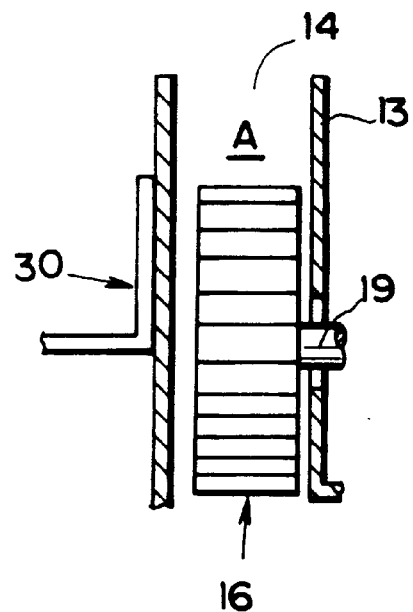
FIG. 5 is a section showing a portion of a specific embodiment of the invention, in which a first auxiliary heat pipe is arranged in a casing.

Another specific embodiment will be described with reference to FIG. 5. This specific embodiment of FIG. 5 adopts a first auxiliary heat pipe. On the lefthand side outer face of the casing 13, as shown in FIG. 5, there is mounted one end portion of a first auxiliary heat pipe 30 in a heat transferable manner. The other end portion of this first auxiliary heat pipe 30 is exposed to the outside of the personal computer case 1. Here, the first auxiliary heat pipe 30 is formed into a flat container like the heat pipe 29 shown in FIG. 3. The remaining construction is identical to that of the specific embodiment shown in FIGS. 1 to 4.

According to the specific embodiment shown in FIG. 5, not only the same effects as those of the specific embodiment shown in FIGS. 1 to 4 are achieved, and the heat of the air, as compressed by the air compressor 16, is discharged through the casing 13 and the first auxiliary heat pipe 30 to the outside of the personal computer case 1. Therefore, the air, as compressed by the air compressor 16, takes an ideal state so that the efficiency of the heat transfer to the heat pipe 29 is improved by the polytropic change of the pressurized air. This makes it possible to prevent the overheat of the CPU 3 more reliably.

Figure 6:
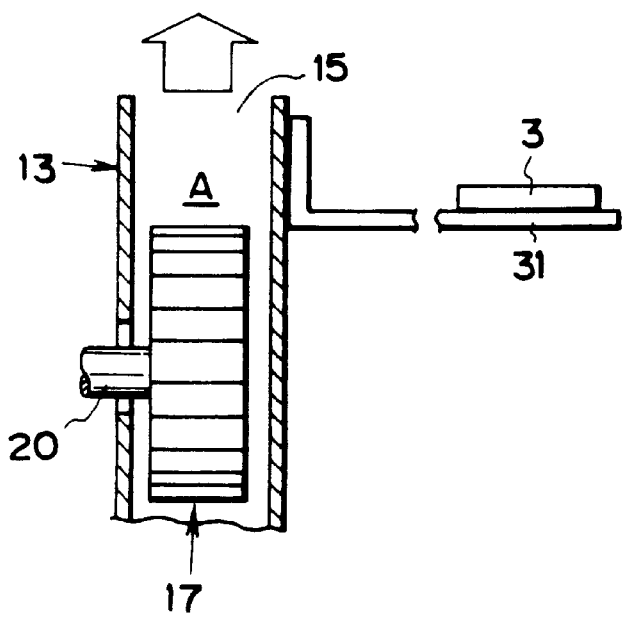
FIG. 6 is a section showing a portion of a specific embodiment of the invention, in which a second auxiliary heat pipe is arranged in a CPU.

Still another specific embodiment will be described with reference to FIG. 6. This specific embodiment of FIG. 6 adopts a second auxiliary heat pipe. On the righthand outer face of the casing 13, as shown in FIG. 6, there is closely fitted one end portion of the second auxiliary heat pipe 31. The other end portion of this second auxiliary heat pipe 31 is fitted on the lower face of the CPU 3, as shown in FIG. 6. Here, the second auxiliary heat pipe 31 is formed into a flat container like the heat pipe 29 shown in FIG. 3. The remaining construction is identical to that of the specific embodiment shown in FIGS. 1 to 4.

According to the specific embodiment shown in FIG. 6, the CPU 3 is subjected to both the cooling actions, in which its heat is transferred to the air and in which it is directly cooled by the second auxiliary heat pipe 31, so that its cooling efficiency for the CPU 3 is better improved than in the foregoing specific embodiment.

Figure 8:
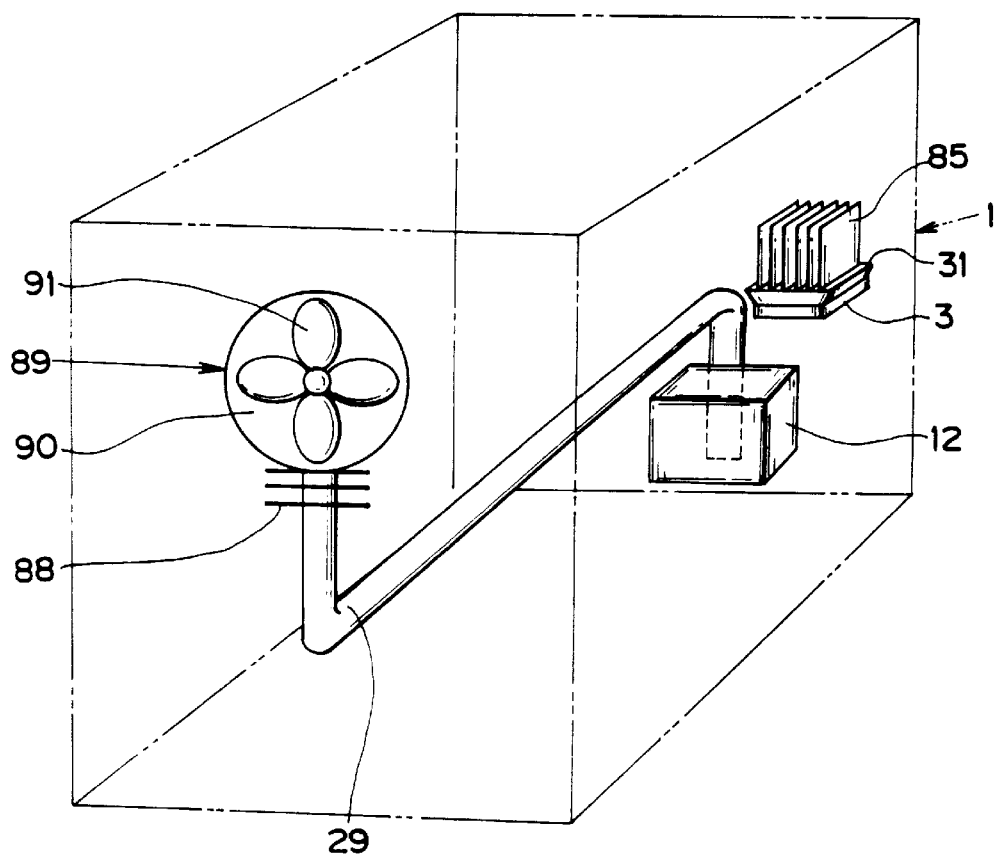
FIG. 8 is a schematic section showing the specific embodiment of FIG. 7.
Figure 9:
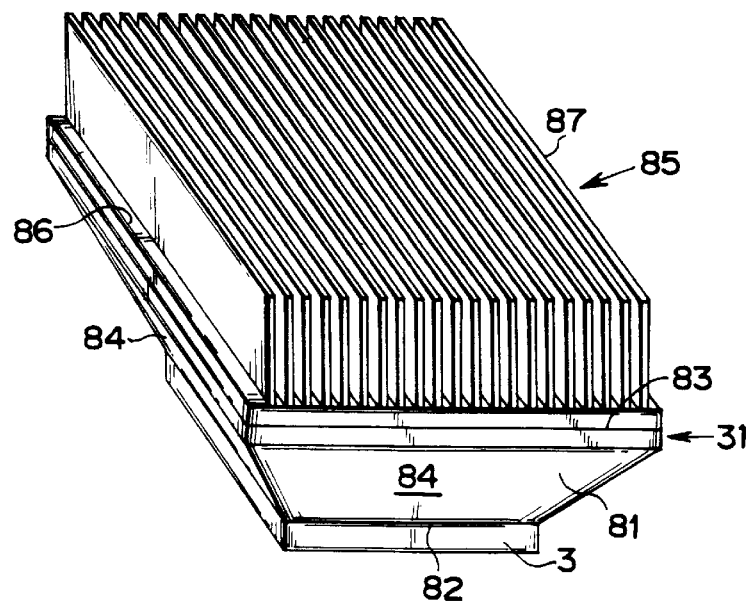
FIG. 9 is a schematic perspective view showing the second auxiliary heat pipe and a heat sink for the cooling operations in the invention.

Another specific embodiment will be described with reference to FIGS. 7 to 9. In this specific embodiment shown in FIGS. 7 to 9, the invention is applied to the desktop type personal computer. Moreover, this specific embodiment adopts a cooling fan. The personal computer case is formed into a box-shaped hollow container having a larger height than the width, as shown in FIG. 8, but is not equipped with an operable display. In this personal computer case 1, there are mounted the HDD 4, the battery 5 and the PC card 6, as located on the bottom in FIG. 7.

Figure 7:
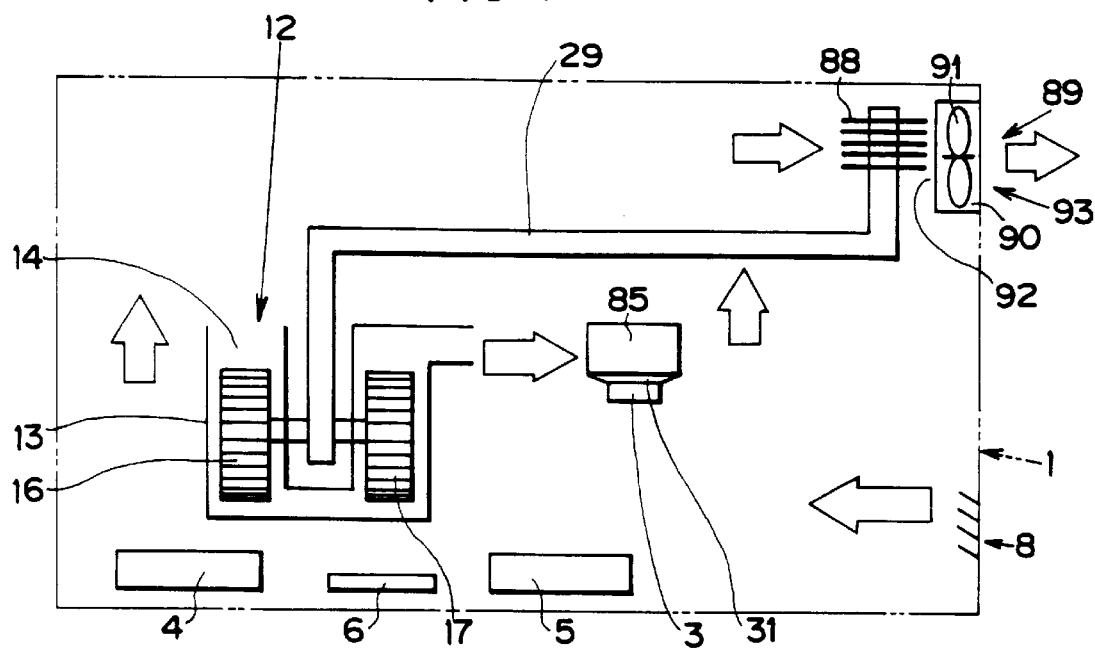
FIG. 7 is a schematic diagram showing a specific embodiment of the invention, which is equipped with a fan.

In the personal computer case 1 over the HDD 4, the battery 5 and the PC card 6, as shown in FIG. 7, there are further arranged the CPU 3 and the Brayton cooler 12. This Brayton cooler 12 is given substantially the same construction as that of the specific embodiment shown in FIGS. 1 to 6, and its intake port 14 is directed toward the HDD 4, the battery 5 and the PC card 6. On the contrary, the discharge port 15 is directed toward the second auxiliary heat pipe 31. Here, the air vent 8 is formed in the right-hand lower wall of the personal computer case 1, as shown in FIG. 7.

The CPU 3 is overlaid by the second auxiliary heat pipe 31. This second auxiliary heat pipe 31 has a container 81 formed into a frustum of quadrangular pyramid, as shown in FIG. 9. More specifically, the container 81 is composed of: a heating portion 82 having a generally square and flat face; a radiation portion 83 having a larger area by about four times than the heating portion 82 and also a generally square and flat face; and sloped side walls 84 jointing the four sides of the radiation portion 83 and the four sides of the heating portion 82 individually. Moreover, the radiation portion 83 and the heating portion 82 are juxtaposed in parallel with each other.

Specifically, the second auxiliary heat pipe 31 is mounted with the radiation portion 83 being positioned upward, as shown in FIG. 7. As shown in FIG. 9, moreover, the radiation portion 83 is overlaid by a heat sink 85. This heat sink 85 is constructed, for example, by arraying a number of thin sheet fins 87 in parallel at a narrow spacing on the upper face of a flat plate base 86.

The one end portion of the heat pipe 29 is connected to the Brayton cooler 12 in a heat transferable manner. The detailed description of the arrangement relation between and the assembly of the Brayton cooler 12 and the heat pipe 29 will be omitted because it is identical to that of the construction shown in FIG. 3. The other end portion of the heat pipe 29 is arranged upward in the vicinity of the righthand upper wall, as shown in FIG. 7, of the personal computer case 1. The same end portion is equipped with a plurality of radiation fins 88. Of the heat pipe 29, more specifically, the end portion, as arranged at the wall side, is positioned at a higher level than that of the end portion attached to the Brayton cooler 12. Here, the radiation fins 88 act as the heat sink.

Here, the intermediate portion of the heat pipe 29 is threaded through the so called "dead space", i.e., through the clearances between the not-shown electronic parts which are mounted in the personal computer case 1. Moreover, the portions, as kept away from contact with the other members, of the heat pipe 29 may be coated on its outer circumference with an insulator. With this construction, it is possible to reduce the heat which might otherwise be released during the action of the heat pipe 29 from the container 81 into the personal computer case 1.

In the vicinity of the end portion of the heat pipe 29, namely, in the vicinity of the righthand upper wall of the personal computer case 1, as shown in FIG. 7, there is mounted a small fan 89. This fan 89 is an axial fan having a construction in which an impeller 91 to be rotationally driven is fitted in a housing 90. The opening of a suction portion 92 of the fan 89 is directed toward the radiation fins 88 of the heat pipe 29. On the other hand, the opening of a discharge portion 93 of the fan 89 is arranged in the vicinity of the (not-shown) discharge port formed in the personal computer case 1.

When the fan 89 is activated, more specifically, the inside air of the personal computer case 1 flows between the radiation fins 88 and enters into the fan 89 until it is discharged through the discharge portion 93 from the discharge port to the outside of the personal computer case 1. The remaining construction is identical to that of the specific embodiment shown in FIGS. 1 to 4.

Here will be described the actions of the aforementioned specific embodiment. When the personal computer is energized for use, the CPU 3, the HDD 4, the battery 5 and the PC card 6 generate heat individually. This heat temporarily elevates the temperature of the air in the personal computer case 1.

When the heat of the CPU 3 is transferred to the heating portion 82 of the second auxiliary heat pipe 31, the working fluid, as reserved in the bottom of the container 81, is heated to evaporate. The vapor of the working fluid flows toward the radiation portion 83 having a low internal pressure of the container 81 so that it is derived of the heat and condensed by the inner face of the radiation portion 83. Since the radiation portion 83 is larger by four times than the heating portion 82, as described above, so that much vapor is condensed, the heat pipe 29 has a high heat transferability. The heat of the radiation portion 83 is transferred to the base 86 of the heat sink 85 and is dissipated from the thin sheet fins 87 into the personal computer case 1. As a result, the CPU 3 is cooled.

When the air compressor 16 and the expansion turbine 17 are activated, on the other hand, the air outside of the personal computer case 1 is sucked into the case 1. Moreover, the temperature-elevated air in the case 1 is sucked into the intake port 14 of the Brayton cooler 12. According to this suction, the HDD 4, the battery 5 and the PC card 6 are cooled.

The air thus sucked into the intake port 14 is adiabatically compressed by the air compressor 16 so that it flows at an elevated temperature to the heat pipe 29. Moreover, the heat of the pressurized air is transmitted to one end portion of the heat pipe 29. Then, the working fluid, as confined in the container of the heat pipe 29, is heated to evaporate. The vapor of this working fluid flows to the end portion, as arranged in the vicinity of the fan 89, of the container so that it is derived of its heat and condensed by the air flowing through the radiation fins 88. The air flow entraining the heat is discharged from the discharge port to the outside of the personal computer case 1.

The pressurized air thus derived of its heat by the heat pipe 29 is adiabatically expanded by the expansion turbine 17 to have a lowered temperature. The air thus cooled is discharged from the discharge port 15 to the second auxiliary heat pipe 31, as indicated by arrows in FIG. 7, and is passed through the thin sheet fins 87. As a result, the heat of the heat sink 85 is carried by the cool air so that the CPU 3 is cooled. The air further flows toward the fan 89 and is passed through the radiation fins 88 of the heat pipe 29 until it is discharged from the discharge portion to the outside of the personal computer case 1. In short, the heat of the CPU 3 is transferred to the temperature-lowered air flow and entrained by the air flow to the outside of the personal computer case 1.

According to the construction shown in FIG. 7, the CPU 3 is cooled not only directly by the second auxiliary heat pipe 31 but also indirectly by the air flow of which the temperature is lowered by the adiabatic expansion, so that the efficiency for cooling the CPU 3 can be better improved than in the foregoing specific embodiment. Moreover, the heat of the CPU 3 is positively discharged by the air flow to the outside of the personal computer case 1 so that it is not confined in the case 1.

Figure 10:
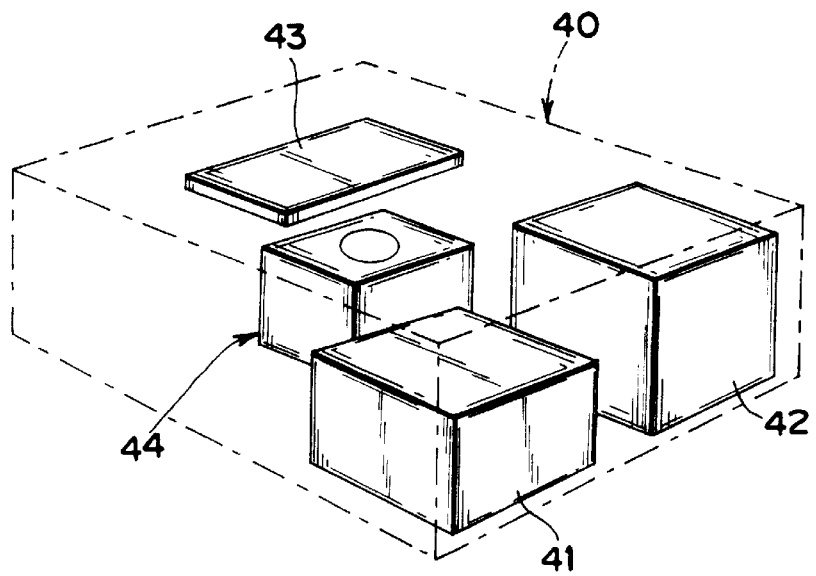
FIG. 10 is a schematic perspective view showing a specific embodiment of the invention, in which the cooler of the invention is applied to a desktop type personal computer or a workstation.

Another specific embodiment will be described with reference to FIG. 10. This embodiment of FIG. 10 is an application of the invention to a desktop personal computer or a workstation, for example. A personal computer case 40 is formed into a box-shaped hollow container and is not equipped with an operable display. In this personal computer case 40, there are arranged a built-in hard disk 41, a power supply 42, a CPU 43 and Brayton cooler 44. This Brayton cooler 44 is given a construction substantially identical to that of the Brayton cooler 12, as exemplified in the specific embodiment shown in FIGS. 2 to 4, in the specific embodiment shown in FIG. 5 or in the specific embodiment shown in FIG. 6. Here, the built-in hard disk 41, the power supply 42 and the CPU 43 correspond to the exothermic members of the invention.

Figure 2:
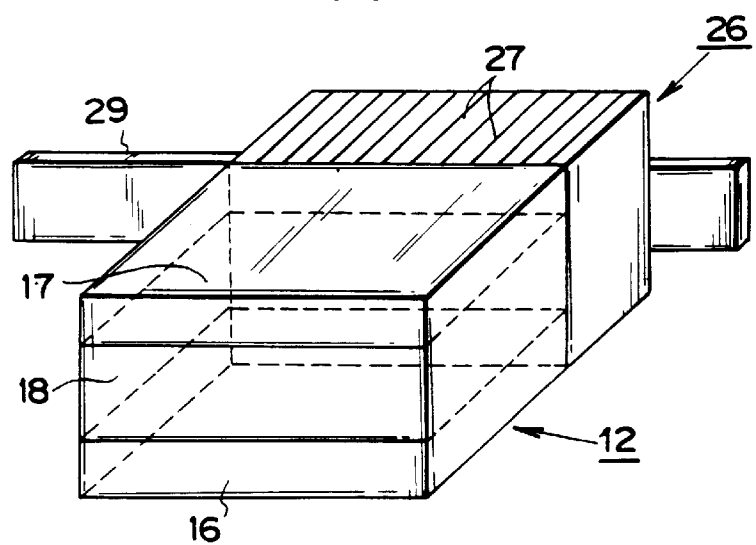
FIG. 2 is also a schematic perspective view showing the cooler.

In the specific embodiment shown in FIG. 10, achieved are the effects similar to those of the specific embodiment shown in FIGS. 2 to 4, of the specific embodiment shown in FIG. 5 or of the specific embodiment shown in FIG. 6.

Figure 11:
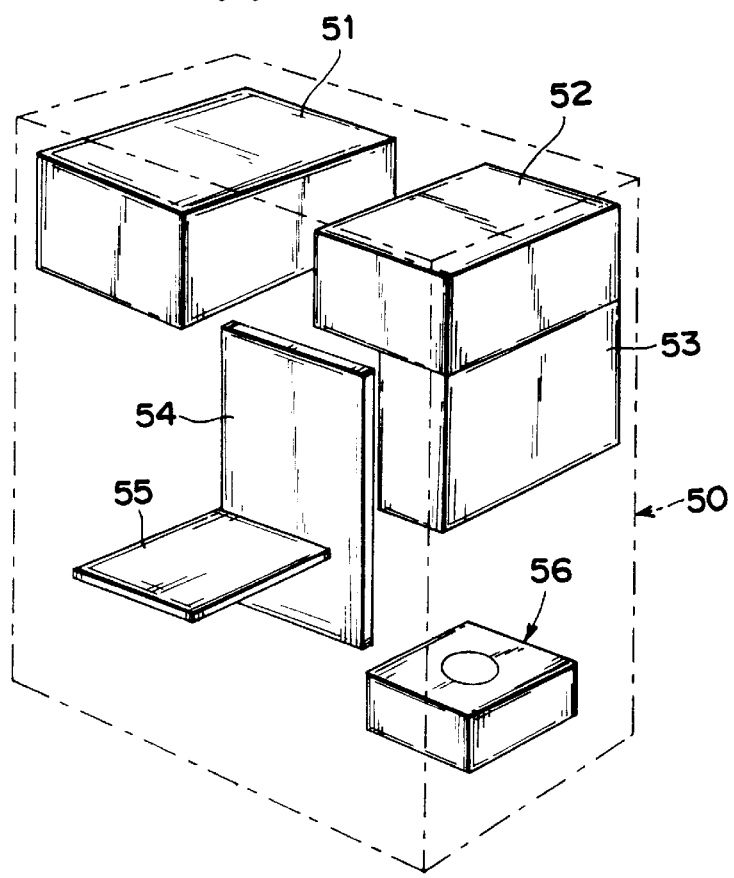
FIG. 11 is a schematic perspective view showing a specific embodiment of the invention, in which the cooler of the invention is applied to a tower type personal computer or a server.

Still another specific embodiment will be described with reference to FIG. 11. This specific embodiment of FIG. 11 is an application of the invention to a server or a tower type personal computer. A personal computer case 50 is formed into a box-shaped hollow container having a larger height than the width, as shown in FIG. 11. In the personal computer case 50, there are arranged a power supply 51, a file slot 52, a drive carrier 53, a main board 54, a PCILAN card 55 and Brayton cooler 56. This Brayton cooler 56 is given a construction substantially identical to that of the Brayton cooler 12 which is exemplified in the specific embodiment of FIGS. 2 to 4, in the specific embodiment of FIG. 5 or in the specific embodiment of FIG 6. Here, the power supply 51, the file slot 52, the drive carrier 53, the main board 54 and the PCILAN card 55 correspond to the exothermic members of the invention.

In the specific embodiment shown in FIG. 11, achieved are the effects similar to those of the specific embodiment shown in FIGS. 2 to 4, of the specific embodiment shown in FIG. 5 or of the specific embodiment shown in FIG. 6.

Figure 12:
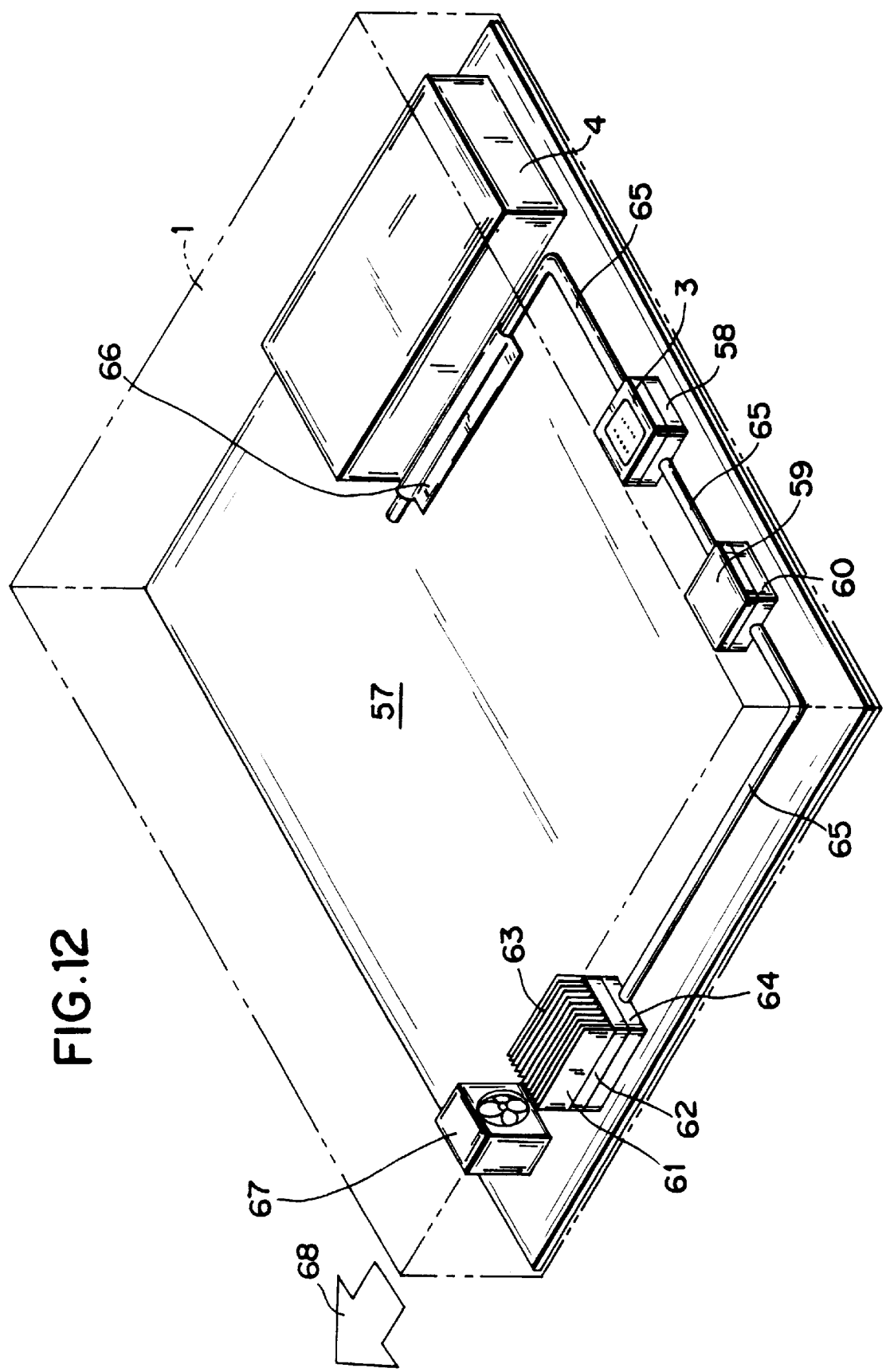
FIG. 12 is a schematic perspective view showing a specific embodiment of the invention, in which a plurality of exothermic members are connected through heat pipes.

Still another specific embodiment will be described with reference to FIG. 12. This specific embodiment of FIG. 12 is an application of the invention to a construction in which a plurality of exothermic members are connected by heat pipes. On the bottom of the inside of the personal computer case 1, there is mounted a radiation plate 57. This radiation plate 57 is made of an aluminum thin sheet having a shape generally identical to that of the bottom of the personal computer case 1, and acts as the electromagnetic shield plate which is a standard equipment of a personal computer. On the upper face of the radiation plate 57 at the righthand side of FIG. 12, there is arranged the HDD 4. This HDD 4 is the well-known type in which the hollow container of plastics or metal is equipped with parts such as a spindle motor for driving the hard disk rotationally and a read/write head.

On the upper face of the radiation plate 57 and at the lefthand lower portion of the HDD 4 of FIG. 12, there is mounted the CPU 3. This CPU 3 is fixed on the radiation plate 57 through a heat transfer plate 58 mounted on the lower face. This heat transfer plate 58 is mounted on the lower face and is a metal plate having the same shape as the bottom shape of the CPU 3. On the other hand, at the bottom of the heat transfer plate 58 there is provided such a semicircular groove in its lower face as profiles the container shape of a heat pipe 65.

On the upper face of the radiation plate 57 and at the lefthand side of the CPU 3, as shown in FIG. 12, there is further mounted a super video graphic array (as will be shortly referred to as the "SVGA") 59 which corresponds to the exothermic member of the invention. This SVGA 59 is fixed on the radiation plate 57 through a heat transfer plate 60 mounted on the lower face.

On the upper face of the radiation plate 57 and at the lefthand side of the SVGA 59, as shown in FIG. 12, there is further mounted a heat sink 61. This heat sink 61 is constructed by arraying a number of thin sheet fins 63 at a narrow interval and in parallel on the upper face of a flat base 62 such that the thin sheet fins 63 are oriented in a leftward oblique direction of FIG. 12. Moreover, the heat sink 61 is fixed on the radiation plate 57 through a heat transfer plate 64 which is mounted on the lower face of the base 62. Here, the individual heat transfer plates 60 and 64 are individually given substantially the same construction as that of the heat transfer plate 58 which is mounted on the CPU 3.

Specifically, the heat pipe 65 connects the HDD 4, the CPU 3, the SVGA 59 and the heat sink 61 substantially integrally. This heat pipe 65 is prepared by confining pure water in a copper contuner having a circular section and equipped with a wick made of very fine carbon fibers, for example. One end portion of the heat pipe 65 is arranged along the side face of the HDD 4 and is fixed on the radiation plate 57 by a fixing member 66 which is constructed to cover the upper face and the side face thereof.

On the contrary, the intermediate portion of the heat pipe 65 is fitted in the respective grooves of the heat transfer plate 58 mounted in the CPU 3 and the heat transfer plate 60 mounted on the SVGA 59. Moreover, the other end portion of the heat pipe 65 is fitted in the groove of the heat transfer plate 64 mounted on the heat sink 61. Here, the heat pipe 65 is threaded through the so-called "dead space", i.e., through the clearances between the not-shown electronic parts which are mounted in the personal computer case 1, and is arranged in contact with the radiation plate 57. Moreover, the portions, as kept away from contact with a fixing member 66 or the individual heat transfer plates 58, 60 and 64, of the heat pipe 65 may be coated on its outer circumference with an insulator. With this construction, it is possible to reduce the heat which might otherwise be released during the action of the heat pipe 65 from the container into the personal computer case 1.

On the upper face of the radiation plate 57 in the vicinity of the heat sink 61, there is mounted a small fan 67. This fan 67 is exemplified by an axial fan which is constructed to have an impeller mounted in the housing and adapted to be rotationally driven. The opening of the suction portion of the fan 67 is directed toward the heat sink 61.

On the contrary, the opening of a discharge portion of the fan 67 is arranged in the vicinity of the (not-shown) discharge port which is formed in the personal computer case 1. When the fan 67 is activated, more specifically, the air in the case 1 passes through the thin sheet fins 63 of the heat sink 61 and then enters the fan 67 from the suction port until it is discharged from the discharge port through the discharge portion to the outside of the personal computer case 1.

Here will be described the actions of the aforementioned specific embodiment. First of all, the fan 67 is activated. Then, the air in the personal computer case 1 passes through the thin sheet fins 63 of the heat sink 61 and flows to the outside of the case 1. When the personal computer is energized for use so that the HDD 4, the CPU 3 and SVGA 59 generate heat individually, this heat is transferred through the heat transfer plates 58 and 60 and the fixing member 66 to the heat pipe 65. On the other hand, the heat of the HDD 4, the CPU 3 and the SVGA 59 are individually transferred to the radiation plate 57.

The working fluid of the heat pipe 65 is evaporated on the individual inner faces, as arranged in the heat transfer plates 58 and 60 and the fixing member 66, of the container. The vapor of the working fluid flows to the end portion (which is arranged in the heat sink 61) of the container, in which both the internal pressure and the temperature are low, so that it is derived of its heat and condensed by the heat sink 61 and an air flow 68.

The working fluid thus restoring the liquid phase is carried by the capillarity pressure of the wick to the other end portion of the heat pipe 65, namely, the end portion which is arranged in the HDD 4. This working liquid is partially evaporated at the portion of the container contacting with the heat transfer plate 60 by the heat of the SVGA 59. Moreover, the remaining working liquid flows to the HDD 4 so that it is partially evaporated at the portion of the container contacting with the heat transfer plate 58 by the heat of the CPU 3. Still moreover, the remaining working liquid flows to the HDD 4 so that it is evaporated at the portion of the container covered with the fixing member 66 by the heat of the HDD 4.

The vapor of the working fluid, as produced at the three portions of the heat pipe 65, flows toward the end portion arranged in the heat sink 61, so that it is derived of its heat to condense by the heat transfer plate 64. In short, the heat of the CPU 3, the HDD 4 and the SVGA 59 is transferred to the heat transfer plate 64. This heat is further transferred through the base 62 to the individual thin sheet fins 63. This heat is entrained by the air flow 68 passing between the thin sheet fins 63 so that it is discharged through the discharge port to the outside of the personal computer case 1 by the air flow 68. As a result, the SVGA 59, the CPU 3 and the HDD 4 are individually cooled.

On the other hand, the heat of the HDD 4, the CPU 3 and the SVGA 59, as transferred to the radiation plate 57, is dissipated from the surface of the radiation plate 57. In other words, the radiation plate 57 acts as the radiation portion shared among the HDD 4, the CPU 3 and the SVGA 59. The heat is transferred to the air flow 68 and is entrained and discharged by the air flow 68 to the outside of the personal computer case 1. As a result, the heat is not confined in the case 1, and the CPU 3, the HDD 4 and the SVGA 59 can be individually prevented from being overheated. Moreover since the heat pipe 65 is arranged in the dead space, since the radiation plate 57 acts as the electromagnetic shield plate and since the fan 67 is only one, the personal computer case 1 can be small-sized.

Figure 13:
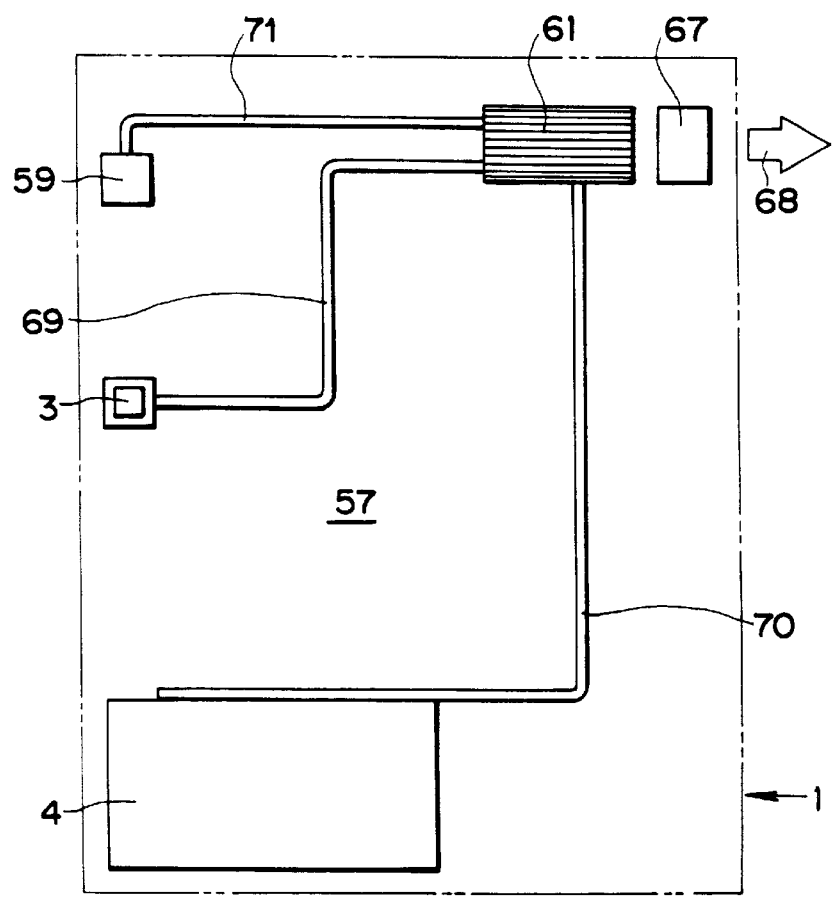
FIG. 13 is a schematic perspective view showing a specific embodiment of the invention, in which the end portions of a plurality of heat pipes are attached to one heat sink.

Another specific embodiment will be described with reference to FIG. 13. This specific embodiment of FIG. 13 is one in which a heat pipe is attached to each of the exothermic members. On the bottom of the personal computer case 1, there is laid the radiation plate 57. On the upper face of the radiation plate 57 in the vicinity of the side wall of the case 1, there is mounted the fan 67. The heat sink 61 is arranged to confront the suction portion side of the fan 67. On the upper face of the radiation plate 57, there are mounted the CPU 3, the HDD 4 and the SVGA 59.

A heat pipe 69 is attached at its one end portion to the CPU 3 in a heat transferable manner. The other end portion of the heat pipe 69 is attached to the heat sink 61 in a heat transferable manner. To the HDD 4, on the other hand, there is attached one end portion of another heat pipe 70 in a heat transferable manner. The other end portion of this heat pipe 70 is attached to the heat sink 61 in a heat transferable manner. To the SVGA 59, moreover, there is attached one end portion of another heat pipe 71 in a heat transferable manner. The other end portion of this heat pipe 71 is attached to the heat sink 61 in a heat transferable manner. In short, the three heat pipes 69, 70 and 71 are attached at their one ends in a ganged arrangement to the heat sink 61. Here, the working temperatures of these heat pipes 69, 70 and 71 are set to match the heat of the corresponding exothermic members. In other words, the three heat pipes 69, 70 and 71 have different working temperatures. The remaining construction is identical to that of the specific embodiment shown in FIG. 12.

According to the construction shown in FIG. 13, therefore, it is possible not only to achieve the same effects as those of the specific embodiment of FIG. 12 but also to prevent the CPU 3, the HDD 4 and the SVGA 59 individually by adopting the plural heat pipes 69, 70 and 71 of the different working temperatures from being more reliably overheated.

Here, the cooler of the invention can also be applied to another electronic device such as a facsimile, a printer or a cooler.

What is claimed is:

1. An electronic device cooler for cooling a plurality of exothermic members, as arranged in a case, with an air flow established by a cooling fan, comprising:

a heat pipe having portions partially and in series connected to said plurality of exothermic members in a heat transferable manner;

a radiation unit, to which another portion of said heat pipe is connected in a heat transferable manner and configured to be cooled by said air flow; and an electromagnetic shield plate, to which said plurality of exothermic members are attached in a heat transferable manner and along which said heat pipe is arranged.

2. An electronic device cooler according to claim 1, wherein said radiation unit includes a heat sink to which one end portion of said heat pipe is connected in a heat transferable manner, and wherein said cooling fan is arranged in a heat transferable manner with respect to said heat sink.

3. An electronic device cooler according to claim 1, wherein said cooling fan is so attached to the peripheral wall of said case as to blow air from the inside to the outside of said case.

4. An electronic device cooler according to claim 1, wherein said plurality of exothermic members include electronic elements.

5. An electronic device cooler for cooling a plurality of exothermic members, as arranged in a case, with an air flow established by a cooling fan, comprising:

a heat pipe having portions partially connected to the plurality of exothermic members in a heat transferable manner;

a radiation unit, to which another portion of said heat pipe is connected in a heat transferable manner, and configured to be cooled by said air flow; and a radiation plate, to which the plurality of exothermic members are attached in a heat transferable manner and along which said heat pipe is arranged, wherein said radiation plate includes an electromagnetic shield plate.

6. An electronic device cooler according to claim 5, wherein said radiation unit includes a heat sink to which one end portion of said heat pipe is connected in a heat transferable manner, and wherein said cooling fan is arranged in a heat transferable manner with respect to said heat sink.

7. An electronic device cooler according to claim 5, wherein said cooling fan is attached to a peripheral wall of said case so as to blow air from the inside to the outside of the case.

8. An electronic device cooler according to claim 5, wherein the plurality of exothermic members include electronic elements.

* * * * *

UNITED STATES PATENT AND TRADEMARK OFFICE
CERTIFICATE OF CORRECTION

PATENT NO.    : 6,308,524 B1
DATED         : October 30, 2001
INVENTOR(S)   : Mochizuki et al.

It is certified that error appears in the above-identified patent and that said Letters Patent is hereby corrected as shown below:

<u>Title page,</u>
Item [62], and column 1, lines 3 & 4, the Related U.S. Application Data, should read:

Related U.S. Application Data
-- [62]  Division of application No. 09/020,896, filed on Feb. 9, 1998, now Patent No. 5,964,279. --

Signed and Sealed this

Thirteenth Day of August, 2002

*Attest:*

JAMES E. ROGAN
*Director of the United States Patent and Trademark Office*

*Attesting Officer*